(12) United States Patent
Huang et al.

(10) Patent No.: US 12,374,528 B2
(45) Date of Patent: Jul. 29, 2025

(54) PLASMA PROCESSING APPARATUS

(71) Applicant: Hitachi High-Tech Corporation, Tokyo (JP)

(72) Inventors: Haixiang Huang, Tokyo (JP); Kenichi Kuwahara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/279,455

(22) PCT Filed: Jun. 7, 2022

(86) PCT No.: PCT/JP2022/022955
§ 371 (c)(1),
(2) Date: Aug. 30, 2023

(87) PCT Pub. No.: WO2023/238235
PCT Pub. Date: Dec. 14, 2023

(65) Prior Publication Data
US 2025/0095963 A1  Mar. 20, 2025

(51) Int. Cl.
*H01J 37/32* (2006.01)

(52) U.S. Cl.
CPC .. *H01J 37/32128* (2013.01); *H01J 37/32146* (2013.01); *H01J 37/32174* (2013.01); *H01J 2237/334* (2013.01)

(58) Field of Classification Search
CPC .......... H01J 37/32128; H01J 37/32146; H01J 37/32174; H01J 2237/334
See application file for complete search history.

(56) References Cited

U.S. PATENT DOCUMENTS

| | | |
|---|---|---|
| 4,985,114 A | 1/1991 | Okudaira et al. |
| 8,568,606 B2 | 10/2013 | Ohse et al. |

(Continued)

FOREIGN PATENT DOCUMENTS

| | | |
|---|---|---|
| JP | H02-105413 A | 4/1990 |
| JP | H06-338476 A | 12/1994 |

(Continued)

OTHER PUBLICATIONS

Office Action mailed Jun. 20, 2024 in Korean Application No. 10-2023-7019656.

(Continued)

*Primary Examiner* — Adam D Houston
(74) *Attorney, Agent, or Firm* — Miles & Stockbridge, P.C.

(57) ABSTRACT

A plasma processing apparatus for controlling a length of a first output duration of a microwave power and a length of a second output duration to obtain a desired etching rate distribution of a wafer, in which one cycle of pulse modulation includes a first output duration of a microwave output and a second output duration having a finite value smaller than the first output, and an OFF duration. An etching rate distribution is a concave distribution for the first output and a convex distribution for the second output, and a control device controls a pulse generator such that when the etching rate distribution is the concave distribution, a length of the first output duration is longer than a length of the second output duration, and when the etching rate distribution is the convex distribution, the length of the first output duration is shorter than the length of the second output duration.

12 Claims, 8 Drawing Sheets

(56) References Cited

U.S. PATENT DOCUMENTS

| | | | | |
|---|---|---|---|---|
| 8,741,095 | B2* | 6/2014 | Koshimizu | H01J 37/32165 156/345.43 |
| 11,355,315 | B2 | 6/2022 | Ikeda et al. | |
| 12,165,851 | B2* | 12/2024 | Ke | H01L 21/31116 |
| 12,191,121 | B2* | 1/2025 | Ikenaga | H01J 37/32568 |
| 2006/0269694 | A1* | 11/2006 | Honda | H01L 21/02252 427/532 |
| 2006/0283549 | A1* | 12/2006 | Aramaki | H01J 37/32192 216/61 |
| 2008/0053818 | A1 | 3/2008 | Ui | |
| 2008/0190893 | A1 | 8/2008 | Mori et al. | |
| 2009/0297404 | A1 | 12/2009 | Shannon et al. | |
| 2010/0258529 | A1 | 10/2010 | Mori et al. | |
| 2011/0031216 | A1 | 2/2011 | Liao et al. | |
| 2011/0248634 | A1 | 10/2011 | Heil et al. | |
| 2011/0309049 | A1 | 12/2011 | Papasouliotis et al. | |
| 2011/0318933 | A1 | 12/2011 | Yatsuda et al. | |
| 2012/0273341 | A1 | 11/2012 | Agarwal et al. | |
| 2013/0122711 | A1 | 5/2013 | Marakhtanov et al. | |
| 2014/0020831 | A1* | 1/2014 | Ohgoshi | H01J 37/32192 156/345.24 |
| 2014/0083977 | A1 | 3/2014 | Ui et al. | |
| 2014/0148016 | A1* | 5/2014 | Kanazawa | H01J 37/32155 156/345.41 |
| 2015/0056808 | A1* | 2/2015 | Ogasawara | H01L 21/31116 438/694 |
| 2016/0254163 | A1* | 9/2016 | Tamari | H01L 21/67253 438/714 |
| 2016/0372307 | A1 | 12/2016 | Yang et al. | |
| 2017/0169996 | A1 | 6/2017 | Ui et al. | |
| 2018/0082821 | A1 | 3/2018 | Norihiko et al. | |
| 2019/0035606 | A1* | 1/2019 | Yoo | H01J 37/32146 |
| 2021/0020408 | A1* | 1/2021 | Sugiyama | H01J 37/32642 |
| 2021/0066040 | A1* | 3/2021 | Kubota | H01J 37/32137 |
| 2024/0096593 | A1* | 3/2024 | Sasaki | H01J 37/32935 |
| 2024/0420923 | A1* | 12/2024 | Ishikawa | H01J 37/32568 |
| 2025/0095963 | A1* | 3/2025 | Huang | H01J 37/32146 |

FOREIGN PATENT DOCUMENTS

| | | | | |
|---|---|---|---|---|
| JP | 2008-060429 A | | 3/2008 | |
| JP | 2008-244429 A | | 10/2008 | |
| JP | 2010050046 A | * | 3/2010 | H01J 37/32192 |
| JP | 2013-535074 A | | 9/2013 | |
| JP | 2014-022482 A | | 2/2014 | |
| JP | 2014-229751 A | | 12/2014 | |
| JP | 2017091783 A | * | 5/2017 | |
| JP | 2018-022599 A | | 2/2018 | |
| JP | 2018-046215 A | | 3/2018 | |
| JP | 2020-017565 A | | 1/2020 | |
| KR | 10-2014-0040640 A | | 4/2014 | |
| KR | 20230084045 A | * | 6/2023 | |
| WO | WO-2022044216 A1 | * | 3/2022 | H01J 37/32128 |
| WO | WO-2023026317 A1 | * | 3/2023 | H01J 37/32091 |
| WO | WO-2023238235 A1 | * | 12/2023 | H01J 37/32311 |
| WO | WO-2024241390 A1 | * | 11/2024 | H01J 37/32174 |
| WO | WO-2025022636 A1 | * | 1/2025 | G01R 29/08 |

OTHER PUBLICATIONS

Search Report mailed Aug. 30, 2022 in International Application No. PCT/JP2022/022955.
Written Opinion mailed Aug. 30, 2022 in International Application No. PCT/JP2022/022955.
Office Action mailed Jul. 2, 2019 in Japanese Application No. 2016-181131.
Office Action mailed Dec. 12, 2017 in Korean Application No. 10-2017-0000145.
Notice of Allowance mailed Feb. 4, 2022 in U.S. Appl. No. 15/445,027.
Office Action mailed Sep. 3, 2019 in U.S. Appl. No. 15/445,027.
Office Action mailed Apr. 30, 2018 in U.S. Appl. No. 15/445,027.
Office Action mailed Oct. 24, 2018 in U.S. Appl. No. 15/445,027.
Office Action mailed Aug. 18, 2020 in U.S. Appl. No. 15/445,027.
Office Action mailed Mar. 3, 2021 in U.S. Appl. No. 15/445,027.

* cited by examiner

[FIG. 1]
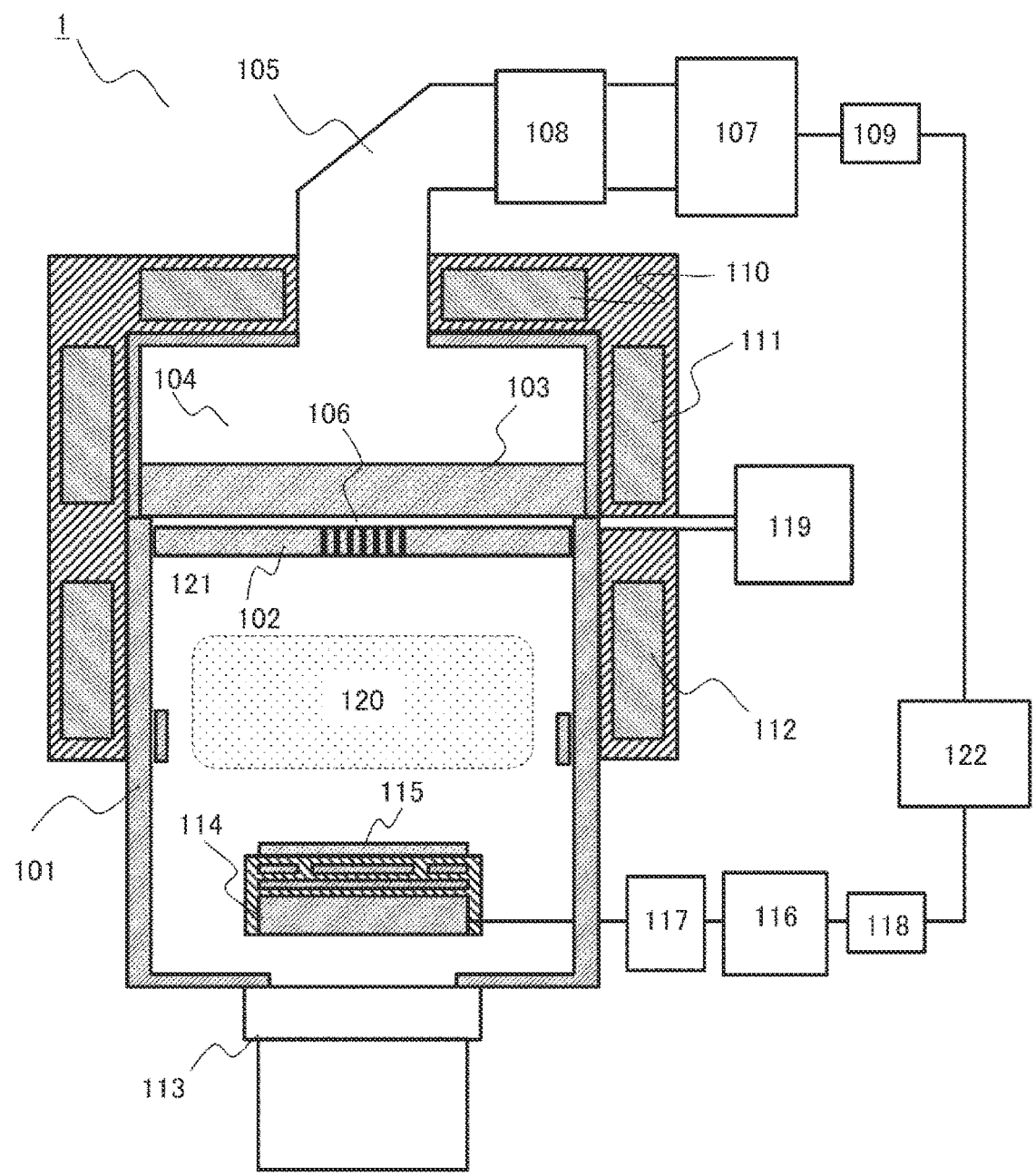

[FIG. 3]
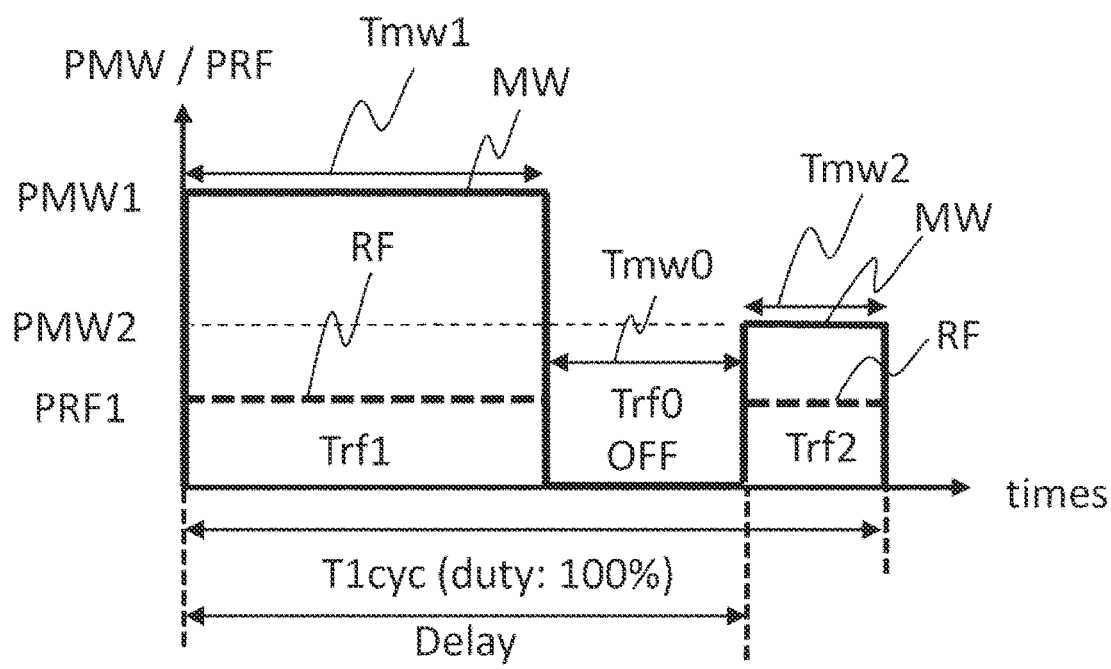
Tmw1: FIRST OUTPUT DURATION
Tmw2: SECOND OUTPUT DURATION
Tmw0: OFF DURATION

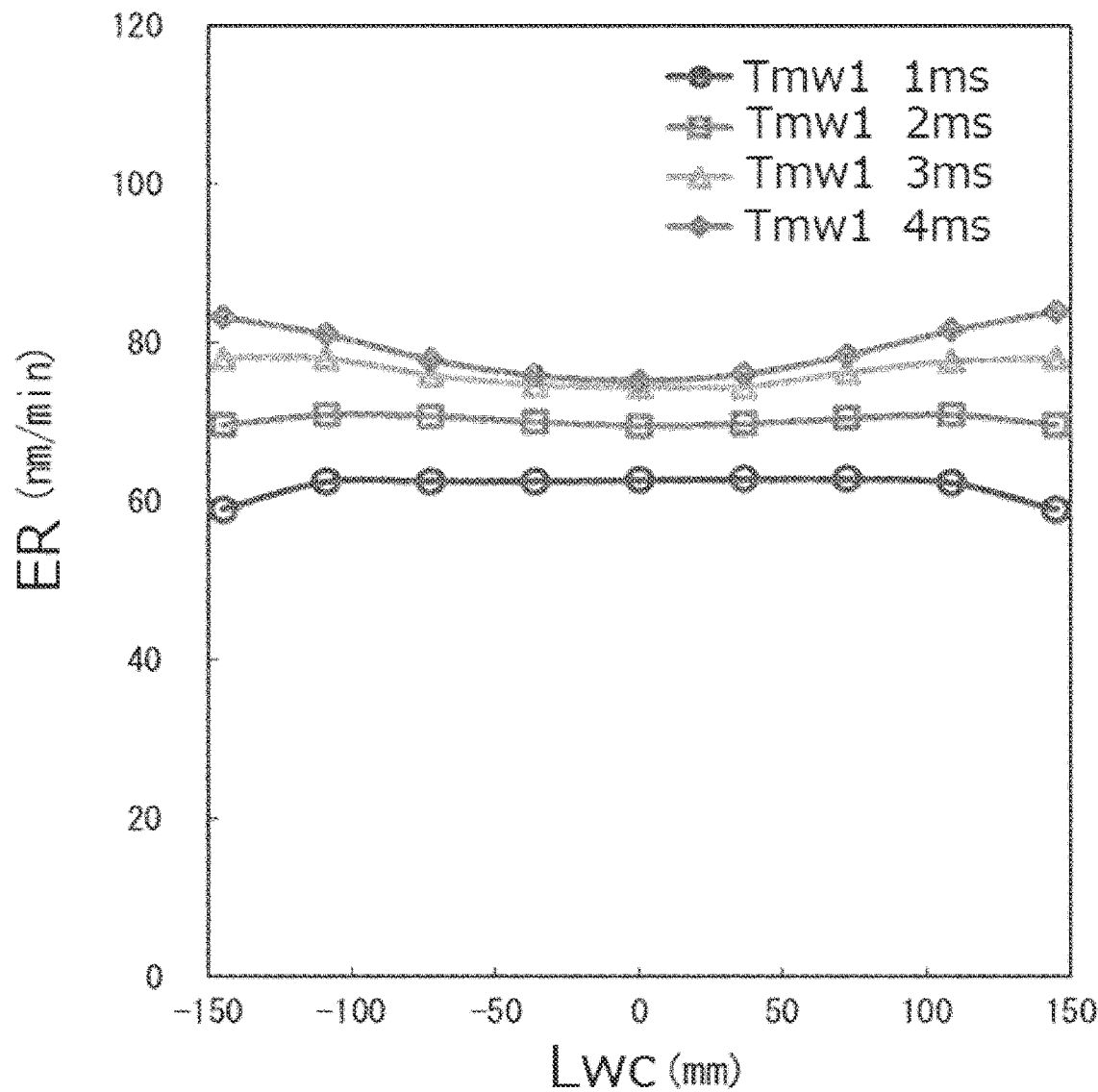
[FIG. 4]

[FIG. 5]
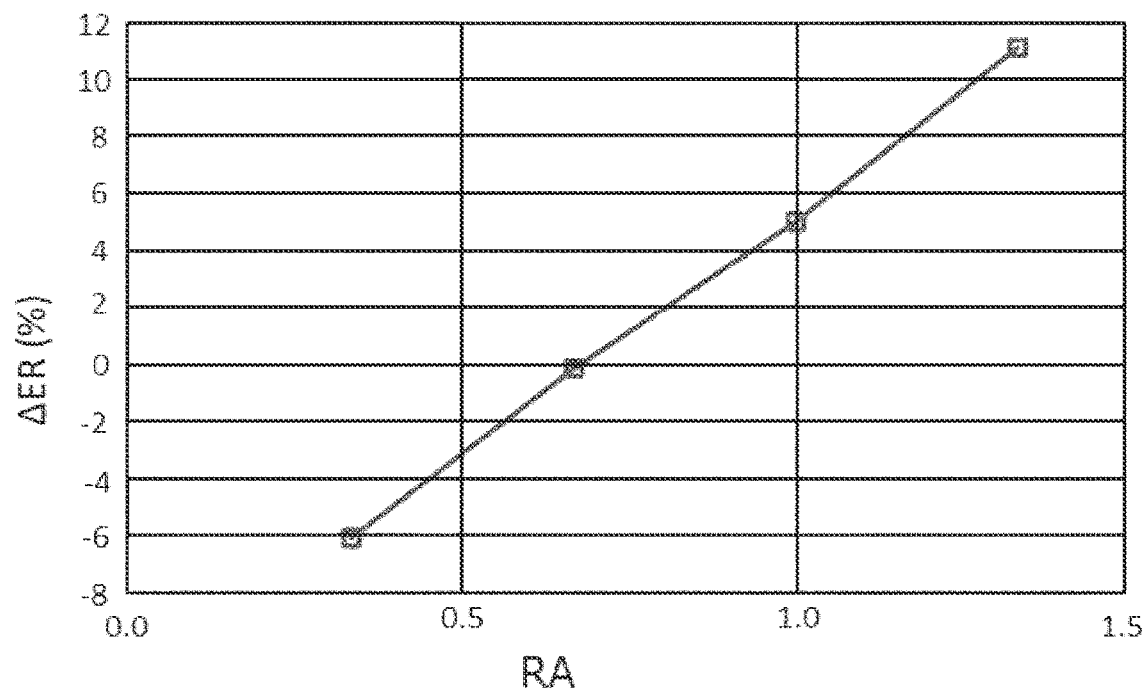

[FIG. 6]
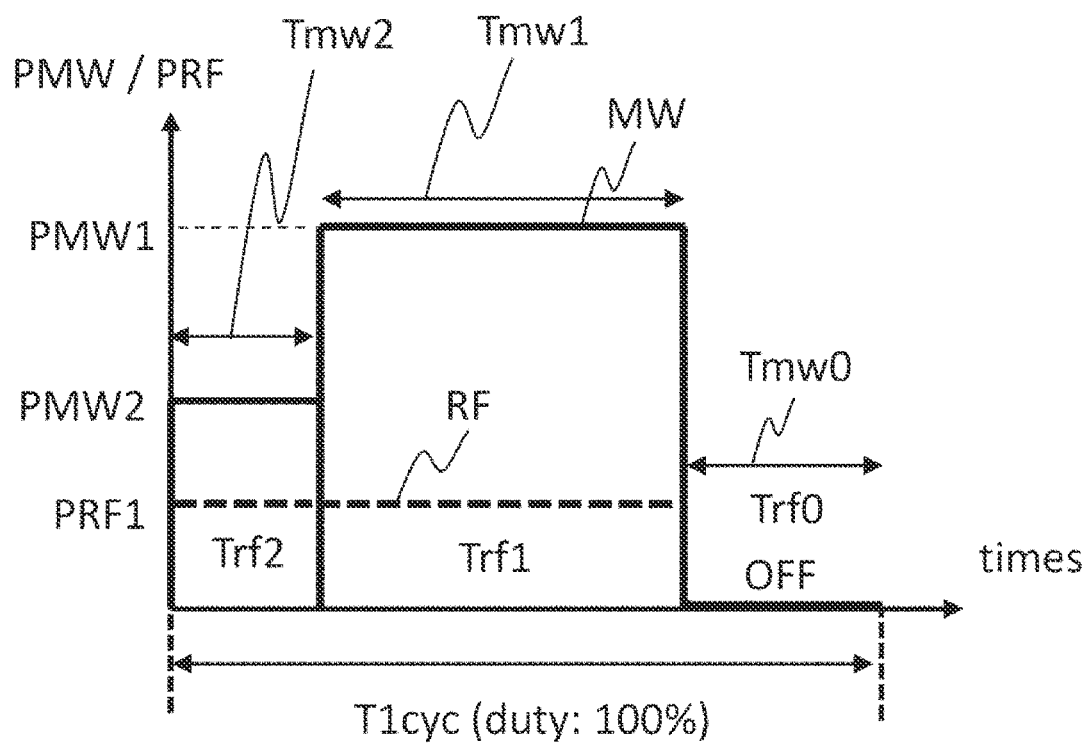

[FIG. 7]
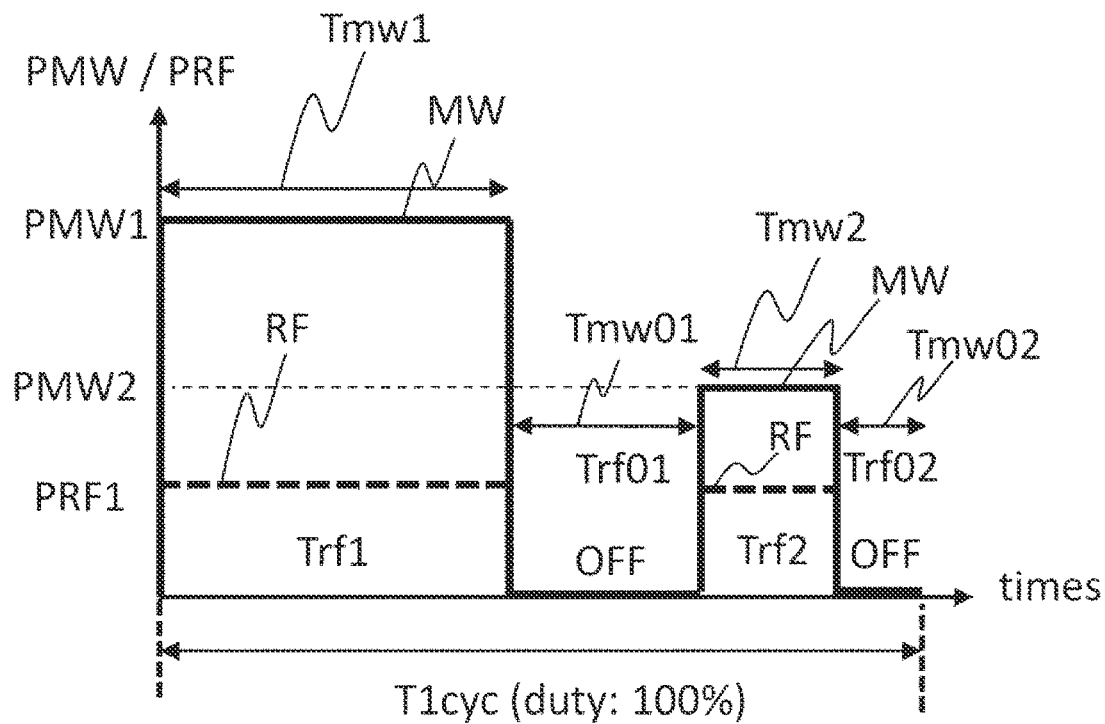
[FIG. 8]
TAB1
| GAS | GFR (ml/min) |
|---|---|
| $Cl_2$ | 100 |
| $NF_3$ | 14 |
| He | 450 |
| Ar | 50 |

[FIG. 9]

TAB2

| | CPA | | |
|---|---|---|---|
| POPF | PMW1 Duty | PMW2 Duty | PMW2 Delay |
| Hz | % | % | % |
| 143 | 14 | 43 | 57 |
| 125 | 25 | 38 | 63 |
| 111 | 33 | 33 | 67 |
| 100 | 40 | 30 | 70 |

[FIG. 10]

TAB3

| Tmw1 | Tmw2 | Tmw0 |
|---|---|---|
| ms | ms | ms |
| 1 | 3 | 3 |
| 2 | 3 | 3 |
| 3 | 3 | 3 |
| 4 | 3 | 3 |

PLASMA PROCESSING APPARATUS

TECHNICAL FIELD

The present invention relates to a plasma etching apparatus for processing a semiconductor device, and provides a plasma processing apparatus capable of precisely controlling an etching rate distribution.

BACKGROUND ART

As an apparatus and a method for processing a semiconductor device, an apparatus and a method for etching a semiconductor device by plasma are known. Here, a technique in the related art will be described by taking a known electron cyclotron resonance (ECR) type plasma etching apparatus as an example. The ECR type plasma etching apparatus is characterized in that high-density plasma can be generated by applying a magnetic field to plasma and setting a magnetic field intensity such that a frequency of a microwave and a cyclotron frequency of an electron resonate.

In this type, when processing the semiconductor device, a radio-frequency power is applied to a sample (a wafer as an example of the sample) in a continuous waveform of a sine wave. Here, the radio-frequency power applied to the sample is referred to as an RF bias. In the above apparatus, ions and radicals generated by the microwave generated by a microwave power supply react with the sample as a material to be etched to proceed etching.

With miniaturization of the semiconductor device in recent years, a processing need for a device having a high aspect ratio structure is increasing, and a demand for controllability of an in-plane distribution of an etching depth is strict. Therefore, it is necessary to control plasma etching processing with high accuracy. In order to control the etching with high accuracy, it is necessary to control an amount of the ions and radicals described above and a spatial distribution.

As a technique I in the related art for realizing such highly accurate plasma etching, PTL 1 (JPH02-105413A) discloses a plasma etching method using pulse discharge. A microwave of time-modulated pulse plasma and an RF bias are turned ON in synchronization, and an ON time and an output power of the microwave and the RF bias are each controlled by a duty ratio (a ratio of a time in which the microwave and the RF bias are applied to a sample to a pulse duration), thereby controlling a density of ions/radicals and balance thereof, and achieving highly accurate anisotropic etching.

As a technique II in the related art, PTL 2 (JP2014-22482A) discloses a method of improving an etching rate distribution by avoiding an ignition duration (unstable duration) of plasma at a timing of turning on (ON) an RF bias and by turning on the RF bias during a duration in which the plasma is stable. However, in the method, since an isotropic etching duration due to radicals occurs, side etching may be excessive when a device or the like is processed.

As a technique III in the related art, PTL 3 (JP2020-17565A) discloses a method in which, in order to reduce excessive side etching, one or a plurality of ON steps of a microwave power lower than an original microwave power of a microwave are provided in a stage before an RF bias is turned ON, stable plasma is formed and radical dissociation is reduced by a low microwave output before the RF bias is turned ON, and a uniform etching rate distribution is obtained while reducing the excessive side etching.

CITATION LIST

Patent Literature

PTL 1: JPH02-105413A
PTL 2: JP2014-22482A
PTL 3: JP2020-17565A

SUMMARY OF INVENTION

Technical Problem

A plasma processing apparatus capable of manufacturing a non-defective semiconductor device up to an outer peripheral portion of a semiconductor wafer is required.

In an etching step for semiconductor device processing, factors such as a plasma density difference, a sheath voltage, a reaction product, and an exhaust velocity are different between an outer peripheral portion and a central portion of a wafer placed on a sample stage. Therefore, there is a problem that an etching rate on the outer peripheral portion of the wafer is lower than an etching rate on the central portion. The problem is a problem not only in an ECR type plasma etching apparatus, but also is common to an inductively coupled plasma (ICP) or capacitively coupled plasma (CCP) etching apparatus, or the like.

In addition to the factors described above, with miniaturization of a device, a need for etching a high aspect ratio structure is increasing, and as the aspect ratio increases, the etching rate on the outer peripheral portion of the wafer is further lowered.

Therefore, when the semiconductor device is processed, control of the etching rate is required on the outer peripheral portion of the wafer to obtain a desired etching rate distribution in a wafer surface.

In the above techniques in the related art, a more uniform plasma density distribution is obtained by shifting a duration in which the RF bias is applied to a duration in which the plasma is stable or by providing a plasma ignition step, which leads to improvement in the etching rate distribution of the wafer.

However, in these techniques in the related art, other than the plasma density distribution, the above factors related to lowering of the etching rate on the outer peripheral portion of the wafer and factors such as a structure of a processing device are not considered, and thus the problem that the etching rate on the outer peripheral portion of the wafer is lowered still exists.

Therefore, the invention provides a plasma processing apparatus capable of rate controlling an etching distribution on an outer peripheral portion of a wafer to be a desired etching rate distribution on the wafer with respect to a control need for the etching rate distribution on the outer peripheral portion of the wafer.

Solution to Problem

The invention is characterized in that in a plasma processing apparatus in which plasma processing is performed by using plasma generated by a pulse-modulated radio-frequency power,
one cycle of pulse modulation includes a first output duration of a microwave output, a second output duration having a finite value smaller than that of the first output of the microwave output, and an OFF duration in which the microwave output is OFF, a radio-frequency (RF) bias is applied in the first output duration and the second output duration, the first output is an output in which an etching rate distribution is a concave distribution, the second output is an output in which the etching rate distribution is a convex distribution, and the plasma processing apparatus includes a control device for controlling a pulse generator that generates the pulse modulation such that when the etching rate distribution is the concave distribution, a length of the first output duration is longer than a length of the second output duration, and when the etching rate distribution is the convex distribution, the length of the first output duration is shorter than the length of the second output duration.

Advantageous Effects of Invention

It is possible to provide a plasma processing apparatus capable of controlling, to a desired distribution, an etching rate distribution (hereinafter, referred to as an ER distribution) on an outer peripheral portion of a wafer by controlling the etching rate distribution using the first output and the second output of the microwave output.

BRIEF DESCRIPTION OF DRAWINGS

FIG. 1 is a schematic configuration diagram showing a longitudinal section of an ECR type microwave plasma etching apparatus according to an embodiment of the invention.

FIG. 3 shows a control pattern A of an ER distribution on an outer peripheral portion of a wafer based on the binary MW power.

FIG. 4 shows a result of an ER distribution on a Poly-Si wafer when a first output is changed from 1 ms to 4 ms.

FIG. 5 shows an increase and decrease rate of an ER (a value measured at a position 145 mm away from a center of a wafer) on the outer peripheral portion when an ER on a central portion of the wafer is set to 100% with respect to a ratio of a first output duration to a second output duration.

FIG. 6 shows a control pattern B of an ER distribution on an outer periphery portion of the wafer based on a binary MW power.

FIG. 7 shows a control pattern C of the ER distribution on the outer periphery portion of the wafer based on the binary MW power.

FIG. 8 is Table 1 showing gases and flow rates used in all embodiments.

FIG. 9 is Table 2 showing an example of setting values of control parameters of a microwave power supply and an RF bias power supply for performing control in a method (A).

FIG. 10 is Table 3 showing a result of control in the example of setting values of parameters.

DESCRIPTION OF EMBODIMENTS

Figure 2A:
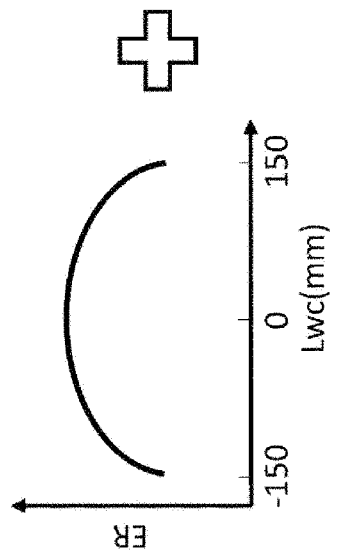
FIGS. 2A-2C show an ER distribution when a characteristic ER distribution of a wafer corresponding to an MW power and a binary MW power having the characteristic ER distribution are combined.

Hereinafter, embodiments of a plasma processing apparatus will be described with reference to the drawings.

FIG. 1 is a schematic configuration diagram showing a longitudinal section of an electron cyclotron resonance (ECR) type microwave plasma etching apparatus (hereinafter, referred to as a plasma processing apparatus 1) according to an embodiment of the invention. Each unit such as a processing chamber 121, a sample stage 114, and a sample 115 in the plasma processing apparatus 1 has a substantially axisymmetric shape such as a cylinder, a circular column, and a disc.

In FIG. 1, a vacuum exhaust device 113 is connected to a lower portion of the processing chamber 121 in a vacuum container 101 of the plasma processing apparatus 1. A shower plate 102 and a quartz top plate 103 are disposed in an upper portion in the processing chamber 121. The shower plate 102 has a plurality of holes. A gas for plasma etching processing supplied from a gas supply device 119 is introduced into the processing chamber 121 through the holes of the shower plate 102. The quartz top plate 103 is disposed above the shower plate 102, and a gas supply gap 106 is provided between the quartz top plate 103 and the shower plate 102. The quartz top plate 103 allows an electromagnetic wave from above to transmit and hermetically seals an upper side of the processing chamber 121.

The sample stage 114 is disposed on a lower side of the processing chamber 121 to face the quartz top plate 103. The sample stage 114 holds a wafer 115 severing as a sample in a state in which the wafer 115 is placed thereon.

A cavity resonance portion 104 is disposed above the quartz top plate 103. An upper portion of the cavity resonance portion 104 is open, and is connected to a waveguide 105 including a vertical waveguide extending in a vertical direction and a waveguide converter serving as a bending portion that bends a direction of the electromagnetic wave by 90 degrees. The waveguide 105 or the like is an oscillation waveguide that propagates the electromagnetic wave, and a microwave power supply 107 for plasma generation is connected to an end portion of the waveguide 105 via a tuner 108.

The microwave power supply 107 is a power supply for plasma generation, and oscillates the electromagnetic wave under control of a control unit 122. The microwave power supply 107 according to the present embodiment can oscillate a microwave of 2.45 GHZ. The microwave oscillated from the microwave power supply 107 is propagated through the waveguide 105 and is propagated into the processing chamber 121 through the cavity resonance portion 104, the quartz top plate 103, and the shower plate 102. Magnetic field generating coils 110, 111, and 112 are disposed on an outer periphery of the processing chamber 121. The magnetic field generating coils include a plurality of coils, and form a magnetic field in the processing chamber 121. A radio-frequency power oscillated from the microwave power supply 107 generates high-density plasma 120 in the processing chamber 121 by interaction between ECR and the magnetic field formed by the magnetic field generating coils 110 to 112.

A microwave pulse unit 109 is connected to the microwave power supply 107. By an ON signal of a pulse from the microwave pulse unit 109, the microwave power supply 107 can pulse-modulate the microwave at a set repetition frequency. The radio-frequency power output from the microwave power supply 107 is referred to as a microwave power (hereinafter, referred to as an MW power). The microwave pulse unit 109 can be regarded as a first pulse generator that generates an ON signal of a pulse and an OFF signal of a pulse for generating pulse modulation.

The control unit 122 is a control device of the plasma etching apparatus 1, is connected to the microwave power supply 107 and a radio frequency bias power supply (RF bias power supply) 116, and controls outputs of the MW power and the RE bias power.

The RF bias power supply 116 generates a radio-frequency power for ion attraction and supplies the radio-frequency power to the sample stage 114. A matching box (matching unit) 117 is connected to the RF bias power supply 116, and thereby RF bias matching is implemented. The matching box 117 functions such that a plasma density is changed by the pulsed oscillation of the microwave, and the RF bias matching is implemented even when plasma impedance fluctuates at a high speed. The RF bias power supply 116 also generates a pulse-modulated RF bias based on an ON pulse of a pulse from an RF bias pulse unit 118. The RF bias pulse unit 118 can be regarded as a second pulse generator that generates an ON signal of a pulse and an OFF signal of a pulse for generating the pulse-modulated RF bias.

The control unit 122 can control a first output of the microwave power supply 107, a second output of the microwave power supply 107, a first output of the RF bias power supply 116, a second output of the RE bias power supply 116, an ON timing and an OFF timing of the pulse in the microwave pulse unit 109, a frequency and a duty ratio of the microwave power supply 107, and a delay time of the microwave power supply 107, based on an input setting (also referred to as a recipe) by an input unit (not shown). Further, based on the recipe, the control unit 122 can control parameters of the microwave power supply 107 and the RF bias power supply 116, such as an ON timing and an OFF timing of the pulse in the RF bias pulse unit 118, a repetition frequency and a duty ratio of ON and OFF of the RF bias power supply 116, and a delay time of the RF bias power supply 116. The control unit 122 can be regarded as a control device that controls the microwave pulse unit 109 serving as the first pulse generator and the RF bias pulse unit 118 serving as the second pulse generator.

Other than the above parameters, the control unit 122 controls etching parameters such as a flow rate of a gas, a processing pressure, a coil current, a sample stage temperature, and an etching time for performing etching.

The plasma etching apparatus according to the embodiment of the invention can control control patterns (see FIGS. 3, 6, and 7) of all binary microwaves described in the embodiment. Although the RE bias is set to be turned ON in synchronization with the MW power in the invention, it is not essential to synchronize the ON timings of the microwave and the RF bias.

Figure 2B:
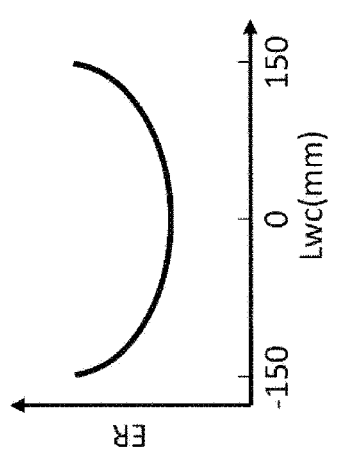
Figure 2C:
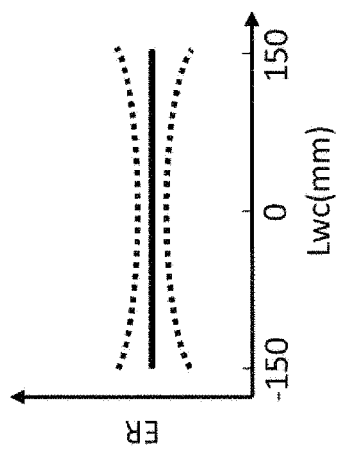

In the invention, when plasma processing is performed by using plasma generated by a time-modulated (pulse-modulated) MW power, an etching rate distribution (hereinafter, the etching rate is referred to as an ER and the etching rate distribution is referred to as an ER distribution) on a sample to be etched, for example, a wafer in which Poly-Si is formed on a surface (hereinafter, referred to as a Poly-Si wafer) changes according to the MW power. FIGS. 2A-2C show an ER distribution when a characteristic ER distribution of a wafer corresponding to the MW power and a binary MW power having the characteristic ER distribution are combined. In FIGS. 2A-2C, a vertical axis represents an etching rate (ER), and a horizontal axis represents a distance Lwc (mm) from a center of the wafer.

Here, the binary MW power means two MW powers that are a low MW power and a high MW power, and means that the MW power has two MW power states that are a low MW power state and a high MW power state in a pulse-modulated pulse waveform for one cycle.

Since plasma generated by the low MW power in FIG. 2A is concentrated on a central portion of the wafer, the ER distribution is a convex distribution (referred to as a second etching rate distribution) in which the ER on an outer peripheral portion of the wafer is low. The shorter an ON time of the plasma (ON time of the low MW power), the lower the ER on the outer peripheral portion of the wafer.

In the high MW power in FIG. 2B, a dissociation degree of the plasma is larger than that of the low MW power, and an electron density rises rapidly on the central portion of the wafer. Since electrons are light, the electrons are instantaneously diffused to the outer peripheral portion of the wafer, and the electron density on the outer peripheral portion of the wafer is increased. Therefore, due to collision of the electrons with a gas, a density of ions or radicals on the outer peripheral portion is increased. When the ON time of the plasma (ON time of the high MW power) becomes longer, the density of the ions or radicals on the outer peripheral portion of the wafer is further increased, and the ER distribution is a concave distribution (referred to as a first etching rate distribution) in which the ER on the outer peripheral portion of the wafer is high.

In the invention, it has been examined whether desired controllability of the ER distribution on the wafer as shown in FIG. 2C can be obtained by using the high MW power and the low MW power corresponding to the characteristic ER distributions in FIG. 2B and FIG. 2A, adjusting the ON times thereof, and controlling an ON time ratio thereof.

In all embodiments, a characteristically high MW power in FIG. 2B is referred to as a first output, and a characteristically low MW power in FIG. 2A is referred to as a second output. As described above, the first output and the second output correspond to changes in respective output durations (a first output duration and a second output duration), and are set to a binary MW power in which a plasma density on the outer peripheral portion of the wafer increases or decreases in proportion.

Embodiment 1

FIG. 3 shows a control pattern A of the ER distribution on the outer peripheral portion of the wafer based on the binary MW power. Hereinafter, details of controlling the ER distribution on the outer peripheral portion in the control pattern A (pattern A) of the ER distribution will be described.

The control pattern A in FIG. 3 shows a pulse-modulated pulse waveform for one cycle. The control pattern A is repeated a predetermined number of times, and plasma processing is performed by using plasma.

One cycle T1cyc in the control pattern A includes a first output duration (a duration of a first output PMW1: a first duration) Tmw1 of the MW power (PMW), a second output duration (a duration of a second output PMW2: second duration) Tmw2 of the MW power (PMW), and an OFF duration (third duration) Tmw0 in which the MW power (PMW) is OFF. That is, one cycle of the pulse modulation includes the duration Tmw1 of the first output PMW1 of the microwave output PMW, the duration Tmw2 of the second output PMW2 (<PMW1) of the microwave output PMW having a finite value smaller than that of the first output PMW1, and the OFF duration Tmw0 in which the microwave output PWN is OFF. In other words, the one cycle of the pulse modulation is a pulse having the first duration (Tmw1) having an amplitude (PMW1) of a finite value, the second duration (Tmw2) having n amplitude (PMW2) of a finite value, and the third duration (Tmw0) having an amplitude of zero. The amplitude (PMW1) of the first duration (Tmw1) is larger than the amplitude (PMW2) of the second duration (Tmw2) (PMW1>PMW2). Here, a radio-frequency power in the first duration (Tmw1) is a power in which an etching rate distribution (concave distribution or convex distribution) is a first etching rate distribution (concave distribution), and a radio-frequency power in the second duration (Tmw2) is a power in which the etching rate distribution (concave distribution or convex distribution) is a second etching rate distribution (convex distribution).

Similar to a microwave output power supply 107, an output PRF of the RE bias power supply 116 also includes a first output duration Trf1, a second output duration Trf2, and an OFF duration Trf0. In the embodiment, the output PRF of the RF bias power supply 116 is set to a same first output PRF1 in the first output duration Trf1 and the second output duration Trf2. In the embodiment, the output PRF of the RF bias power supply 116 is ON (the first output PRF1 is applied) and OFF (the first output PRF1 is not applied) in synchronization with the MW power supply output (PMW1, PMW2).

By using the control unit 122 of the plasma processing apparatus 1, a length of the first output duration Tmw1 and a length of the second output duration Tmw2 can be controlled independently. A duration between the first output duration Tmw1 and the second output duration Tmw2 is controlled by using a ratio of each duration to a pulse duration (hereinafter, referred to as a duty ratio) and a delay. The ratio (duty ratio) is a ratio when the one cycle T1cyc is set to 100% as shown in FIG. 3. The control unit 122 can perform a combination of any microwave outputs corresponding to the first output PMW1 and the second output PMW2.

In order to control the ER distribution on the outer peripheral portion of the wafer, three methods are conceivable, i.e., a case 1 of adjusting the first output duration Tmw1 corresponding to the ER concave distribution in which the ER on the outer peripheral portion is high, a case 2 of adjusting the second output duration Tmw2 corresponding to the ER convex distribution in which the ER on the outer peripheral portion is low, and a case 3 of simultaneously adjusting the first output duration Tmw1 and the second output duration Tmw2.

First, as a first method (A), a method of changing the first output duration Tmw1 having a finite value and fixing the second output duration Tmw2 having a finite value and the OFF duration Tmw0 will be described.

FIG. 8 is Table 1 (TAB1) showing a gas type GAS and a gas flow rate GFR (ml/min) used in all Embodiments 1 to 3. FIG. 9 is Table 2 (TAB2) showing an example of setting values of control parameters CPA of the microwave power supply 107 and the RF bias power supply 116 for performing control in the method (A). Table 2 (TAB2) shows a power supply output pulse frequency POPF (Hz), a duty (%) of the first output PMW1, a duty (%) of the second output PMW2, and a delay (%) of an ON timing of the second output PMW2. By setting the duty of the first output PMW1, the duty of the second output PMW2, and the delay of the ON timing of the second output PMW2, the first output duration Tmw1, the second output duration Tmw2, the OFF duration Tmw0, the ON timing, and an OFF timing are set. FIG. 10 is Table 3 (TAB3) showing a result (the first output duration Tmw1, the second output duration Tmw2, and the OFF duration Tmw0) of control in the example of setting values of parameters.

In Tables 1 to 3 (TAB1, TAB2, and TAB3) shown in FIGS. 8 to 10, decimals are rounded off.

Table 3 (TAB3) shows a control example in which the first output duration Tmw1 is changed from 1 ms to 4 ms, and the second output duration Tmw2 and the OFF duration Tmw0 are fixed to 3 ms. Although not described, the output PRF of the RF bias power supply 116 is turned ON and OFF in synchronization with the MW power supply output (PMW1, PMW2).

FIG. 4 shows a result of the ER distribution on the Poly-Si wafer when the first output duration Tmw1 is changed from 1 ms to 4 ms. In FIG. 4, a vertical axis represents an etching rate ER (nm/min) for the Poly-Si wafer, and a horizontal axis represents a distance Lwc (mm) from the center of the wafer.

When the first output duration Tmw1 is short (for example, 1 ms), the ER distribution on the wafer is the ER convex distribution in which the ER on the outer peripheral portion of the wafer is low. When the first output duration Tmw1 becomes longer (for example, 2 ms), the ER on the outer peripheral portion and the ER on a central portion of the wafer are at a same level. Further, when the first output duration Tmw1 is extended (for example, 3 ms or 4 ms), the ER distribution is the ER convex distribution in which the outer peripheral portion of the wafer is high. That is, when the first output duration Tmw1 is shorter than the second output duration Tmw2, the ER distribution is the convex distribution (second etching rate distribution), and when the first output duration Tmw1 is longer than the second output duration Tmw2, the ER distribution is the concave distribution (first etching rate distribution).

A correlation between a change in the ER distribution on the outer peripheral portion of the wafer and a ratio of the first output duration Tmw1 to the second output duration Tmw2 will be described below.

FIG. 5 shows an increase and decrease rate ($\Delta$ER (%)) of the ER on the outer peripheral portion (edge: for example, a value measured at a position 145 mm away from a center of a wafer) when the ER on the central portion (center) of the wafer is set to 100% with respect to a ratio RA (RA=first output duration Tmw1/second output duration Tmw2) of the first output duration Tmw1 to the second output duration Tmw2. $\Delta$ER (%) is obtained by the following equation.

$$\Delta ER(\%) = ((ER(\text{edge}) - ER(\text{center}))/(ER(\text{center})) \times 100\%$$

When the increase and decrease rate ($\Delta$ER (%)) is negative, it means that the ER on the outer peripheral portion is lower than the ER on the central portion, and when the increase and decrease rate ($\Delta$ER (%) is positive, the ER on the outer peripheral portion is higher than the ER on the central portion. From FIG. 5, it is understood that the increase and decrease rate ($\Delta$ER (%)) of the ER linearly changes with respect to the ratio RA of the first output duration Tmw1 to the second output duration Tmw2. In other words, with respect to length adjustment of the first output duration Tmw1, a plasma density of the outer peripheral portion of the wafer is increased in proportion, and the ER distribution on the outer peripheral portion of the wafer can be controlled from the convex distribution in which the ER on the outer peripheral portion is low to the concave distribution in which the ER at an outer periphery portion is high.

In order to achieve the desired ER distribution on the wafer, in addition to the adjustment method (A), there are a method (B) of controlling the second output duration Tmw2 having a finite value and fixing the first output duration Tmw1 having a finite value and the OFF duration Tmw0 having a finite value, and a method (C) of simultaneously controlling the first output duration Tmw1 having a finite value and the second output duration Tmw2 having a finite value and fixing the OFF duration Tmw0 having a finite value. That is, in order to control the ratio of the first output duration Tmw1 to the second output duration Tmw2, the control unit 122 can fix one of the first output duration Tmw1 and the second output duration Tmw2 and adjust the other ((A) or (B)), or simultaneously adjust both the first output duration Tmw1 and the second output duration Tmw2 (C).

In the method (B), when the second output duration Tmw2 is set to be short, the relatively fixed first output duration Tmw1 becomes longer, and the ER distribution tends to be the concave distribution. Conversely, (when the second output duration Tmw2 is set to be long, the relatively fixed first output duration Tmw1 becomes shorter,) the ER distribution is controlled to the ER convex distribution in which the ER on the outer peripheral portion is low.

The method (C) is the same as the methods (A) and (B), in which the ER distribution on the outer peripheral portion is controlled by controlling the output duration ratio RA of the first output duration Tmw1 to the second output duration Tmw2. A difference is that the first output duration Tmw1 and the second output duration Tmw2 simultaneously change.

In any method (method A, B, or C), by controlling the ratio RA of the first output duration Tmw1 to the second output duration Tmw2 as shown in FIG. 5, the desired ER distribution on the outer peripheral portion of the wafer is obtained.

In addition to the control pattern A (pattern A), the following control patterns B (pattern B) and C (pattern C) are verified, and controllability of the ER distribution on the outer peripheral portion of the wafer has been confirmed.

Embodiment 2

FIG. 6 shows the control pattern B of an ER distribution on an outer periphery portion of a wafer based on a binary MW power. The control pattern B (pattern B) shows a pulse-modulated pulse waveform for one cycle. The control pattern B is repeated a predetermined number of times, and plasma processing is performed by using plasma.

One cycle T1cyc in the control pattern B includes the second output duration Tmw2 in which the MW power PMW is the second output PMW2, the first output duration Tmw1 in which the MW power PMW is the first output PMW1, and the OFF duration Tmw0 in which the MW power PMW is OFF. The first output duration Tmw1 is set between the second output duration Tmw2 and the OFF duration Tmw0. Similar to an MW output PMW of the microwave output power supply 107, the output PRF of the RF bias power supply 116 also has the second output duration Trf2, the first output duration Trf1, and the OFF duration Trf0. The first output duration Trf1 is set between the second output duration Trf2 and the OFF duration Trf0. By using the control unit 122 of the plasma processing apparatus 1, the second output duration Tmw2 and the first output duration Tmw1 can be controlled independently. A desired ER distribution on an outer peripheral portion of the wafer is obtained by using the control pattern B and controlling the ratio RA of the first output duration Tmw1 to the second output duration Tmw2 by the methods (A) to (C).

Embodiment 3

FIG. 7 shows the control pattern C of an ER distribution on an outer periphery portion of a wafer based on a binary MW power. The control pattern C (Pattern C) shows a pulse-modulated pulse waveform for one cycle. The control pattern C is repeated a predetermined number of times, and plasma processing is performed by using plasma.

One cycle T1cyc of the control pattern C includes the first output duration Tmw1 in which the MW power PMW is the first output PMW1, a first OFF duration Tmw01 in which the MW power PMW is OFF, the second output duration Tmw2 in which the MW power PMW is the second output PMW2, and a second OFF duration Tmw02 in which the MW power PMW is OFF. The first OFF duration Tmw01 is set between the first output duration Tmw1 and the second output duration Tmw2, and the second output duration Tmw2 is set between the first OFF duration Tmw01 and the second OFF duration Tmw02. Similar to an MW output PMW of the microwave output power supply 107, the output PRF of the RF bias power supply 116 also includes the first output duration Trf1, a first OFF duration Trf01, a second output duration Trf2, and a second OFF duration Trf02. By using the control unit 122 of the plasma processing apparatus 1, the first output duration Tmw1 and the second output duration Tmw2 can be controlled independently. A desired ER distribution on an outer peripheral portion of the wafer is obtained by using the control pattern C and controlling the ratio RA of the first output duration Tmw1 to the second output duration Tmw2 by the methods (A) to (C).

That is, as described in Embodiments 1 to 3, the control unit 122 can freely set the order for the first output duration Tmw1, the second output duration Tmw2, and the OFF duration by controlling an ON timing and an OFF timing in the first output duration Tmw1 and controlling an ON timing and an OFF timing in the second output duration Tmw2. The control unit 122 can also freely set the number of OFF durations (two including the first OFF duration Trf01 and the second OFF duration Trf02 in Embodiment 3).

The invention relates to a plasma processing apparatus that is characterized in that the first output duration Tmw1 having a finite value and the second output duration Tmw2 having a finite value are independently controlled, and a length of the first output duration Tmw1 and a length of the second output duration Tmw2 are controlled to obtain a desired ER distribution of a wafer.

Further, Embodiments 1 to 3 are examples in which the invention is applied to an ECR type microwave plasma etching apparatus, and the invention can also be similarly applied to a capacitively coupled or inductively coupled plasma etching apparatus.

While the invention made by the present inventor has been specifically described based on the embodiments, it is needless to say that the invention is not limited to the above embodiments and examples, and various modifications are possible.

For example, in a case in which a pulse-modulated pulse waveform is repeated a predetermined number of times and plasma processing is performed by using plasma, the continuous pulse waveform may be a pulse waveform of a combination of two control patterns (control patterns A and B, control patterns A and C, or control patterns B and C) selected from the control pattern A in FIG. 3, the control pattern B in FIG. 6, and the control pattern C in FIG. 7, or a pulse waveform of a combination of three control patterns (control patterns A, B, and C).

Characteristics of the plasma processing apparatus according to the embodiments can be summarized as follows.

1) A plasma processing apparatus (1) including:
   a processing chamber (121) configured to allow sample (115) to be subjected to plasma processing;
   a radio-frequency power supply (107) configured to supply a radio-frequency power for generating plasma;

a sample stage (114) configured to allow the sample (115) to be placed; and a control device (122) configured to control a length of a first duration (Tmw1) having an amplitude (PMW1) of a finite value or a length of a second duration (Tmw2) having an amplitude (PMW2) of a finite value such that an etching rate distribution in plasma processing is a desired etching rate distribution (concave distribution or convex distribution) when the radio-frequency power is modulated by a pulse having the first duration (Tmw1), the second duration (Tmw2), and a third duration (Tmw0) having an amplitude of zero, in which the radio-frequency power in the first duration (Tmw1) is a power in which the etching rate distribution (concave distribution or convex distribution) is a first etching rate distribution (concave distribution), and the radio-frequency power in the second duration (Tmw2) is a power in which the etching rate distribution (concave distribution or convex distribution) is a second etching rate distribution (convex distribution).

2) The length of the first duration (Tmw1) and the length of the second duration (Tmw2) are independently controlled by the control device (122).

3) When the first etching rate distribution (concave distribution) is the desired etching rate distribution, the length of the first duration (Tmw1) or the length of the second duration (Tmw2) is controlled by the control device (122) such that the length of the first duration (Tmw1) is longer than the length of the second duration (Tmw2).

4) When the second etching rate distribution (convex distribution) is the desired etching rate distribution, the length of the first duration (Tmw1) or the length of the second duration (Tmw2) is controlled by the control device (122) such that the length of the first duration (Tmw1) is shorter than the length of the second duration (Tmw2).

5) The amplitude (PMW1) in the first duration (Tmw1) is larger than the amplitude (PMW2) in the second duration (Tmw2).

6) The third duration (Tmw0) is a duration between the first duration (Tmw1) and the second duration (Tmw2) (see FIG. 3).

7) The first etching rate distribution is a concave distribution, and the second etching rate distribution is a convex distribution.

REFERENCE SIGNS LIST

1: ECR type microwave plasma etching apparatus
101: vacuum container
102: shower plate
103: quartz top plate
104: cavity resonance portion
105: waveguide
106: gas supply gap
107: microwave power supply
108: tuner
109: microwave pulse unit
110: Magnetic field generating coil
111: Magnetic field generating_coil
112: Magnetic field generating_coil
113: vacuum exhaust device
114: sample stage
115: sample
116: RF bias power supply
117: matching box (matching unit)
118: RF bias pulse unit
119: gas supply device
120: high-density plasma
121: processing chamber
122: control unit

The invention claimed is:

1. A plasma processing apparatus comprising:
a processing chamber configured to allow a sample to be subjected to plasma processing;
a radio-frequency power supply configured to supply a radio-frequency power for generating plasma;
a sample stage configured to allow the sample to be placed; and
a control device configured to control a length of a first duration having an amplitude of a finite value or a length of a second duration having an amplitude of a finite value such that an etching rate distribution in plasma processing is a desired etching rate distribution when the radio-frequency power is modulated by a pulse having the first duration, the second duration, and a third duration having an amplitude of zero, wherein
the radio-frequency power in the first duration is a power in which the etching rate distribution is a first etching rate distribution, and
the radio-frequency power in the second duration is a power in which the etching rate distribution is a second etching rate distribution.

2. The plasma processing apparatus according to claim 1, wherein
the length of the first duration and the length of the second duration are independently controlled by the control device.

3. The plasma processing apparatus according to claim 1, wherein
when the first etching rate distribution is the desired etching rate distribution, the length of the first duration or the length of the second duration is controlled by the control device such that the length of the first duration is longer than the length of the second duration.

4. The plasma processing apparatus according to claim 2, wherein
when the first etching rate distribution is the desired etching rate distribution, the length of the first duration or the length of the second duration is controlled by the control device such that the length of the first duration is longer than the length of the second duration.

5. The plasma processing apparatus according to claim 3, wherein
when the second etching rate distribution is the desired etching rate distribution, the length of the first duration or the length of the second duration is controlled by the control device such that the length of the first duration is shorter than the length of the second duration.

6. The plasma processing apparatus according to claim 4, wherein
when the second etching rate distribution is the desired etching rate distribution, the length of the first duration or the length of the second duration is controlled by the control device such that the length of the first duration is shorter than the length of the second duration.

7. The plasma processing apparatus according to claim 1, wherein
the amplitude in the first duration is larger than the amplitude in the second duration.

8. The plasma processing apparatus according to claim 1, wherein
the third duration is a duration between the first duration and the second duration.

9. The plasma processing apparatus according to claim 7, wherein
   the third duration is a duration between the first duration and the second duration.

10. The plasma processing apparatus according to claim 5, wherein
    the third duration is a duration between the first duration and the second duration.

11. The plasma processing apparatus according to claim 1, wherein
    the first etching rate distribution is a concave distribution, and
    the second etching rate distribution is a convex distribution.

12. The plasma processing apparatus according to claim 3, wherein
    the first etching rate distribution is a concave distribution, and
    the second etching rate distribution is a convex distribution.

* * * * *